(12) United States Patent
Oxford

(10) Patent No.: US 6,405,092 B1
(45) Date of Patent: Jun. 11, 2002

(54) METHOD AND APPARATUS FOR AMPLIFYING AND ATTENUATING DIGITAL AUDIO

(76) Inventor: William Vincent Oxford, 8005 Jester Blvd., Austin, TX (US) 78750

( * ) Notice: Subject to any disclaimer, the term of this patent is extended or adjusted under 35 U.S.C. 154(b) by 0 days.

(21) Appl. No.: 08/939,990

(22) Filed: Sep. 29, 1997

(51) Int. Cl.[7] .............. G06F 17/00; H03G 3/00; H04R 3/00
(52) U.S. Cl. ............ 700/94; 381/104; 381/111; 381/117; 377/69
(58) Field of Search ................ 381/111, 117, 381/401, 102, 104, 106, 107, 108, 109; 700/94; 377/69, 64, 68, 71, 130; 360/13, 32

(56) References Cited

U.S. PATENT DOCUMENTS

| | | | | | |
|---|---|---|---|---|---|
| 3,596,251 A | * | 7/1971 | Buchan et al. | ................ | 377/69 |
| 3,810,112 A | * | 5/1974 | Aho et al. | ............... | 340/172.5 |
| 4,356,517 A | * | 10/1982 | Ozaki et al. | .................. | 360/13 |
| 4,449,061 A | * | 5/1984 | Yasuda et al. | .............. | 307/268 |
| 4,499,459 A | * | 2/1985 | Sasaki et al. | ............... | 340/752 |
| 4,660,217 A | * | 4/1987 | Yamada | ....................... | 377/66 |
| 4,811,370 A | * | 3/1989 | Yamada et al. | ............... | 377/54 |
| 4,813,014 A | * | 3/1989 | DeBell | ....................... | 365/45 |
| 5,325,240 A | * | 6/1994 | Okada et al. | ................ | 360/39 |
| 5,489,901 A | * | 2/1996 | Fukuda et al. | ................ | 377/64 |
| 5,745,541 A | * | 4/1998 | Lin et al. | ...................... | 377/69 |
| 5,771,268 A | * | 6/1998 | Aoki et al. | .................... | 377/69 |
| 5,862,231 A | * | 1/1999 | Tokuhisa | .................... | 381/61 |

* cited by examiner

Primary Examiner—Xu Mei
(74) Attorney, Agent, or Firm—Mark Aaker

(57) ABSTRACT

An apparatus for controlling audio signals having pulse code modulation (PCM) data and methods of operating the same result in efficient modulation of the audio signals. The apparatus for controlling audio signals comprises a PCM data input register configured to store the PCM data. A shift register is coupled to the PCM data input register configured to serially shift the PCM data. A PCM data output register is coupled to the shift register configured to store modified PCM data. An audio magnitude controller is coupled to the shift register configured to control serial shifting of the shift register to provide the modified PCM data.

8 Claims, 2 Drawing Sheets

METHOD AND APPARATUS FOR AMPLIFYING AND ATTENUATING DIGITAL AUDIO

BACKGROUND OF THE INVENTION

1. Field of the Invention

The present invention relates to amplifying and attenuating of digital audio signals and more particularly to logarithmically manipulate pulse code modulation data in order to boost or to attenuate the digital audio signals.

2. Description of the Related Arts

As computers continue to proliferate in our society, the tasks which they are used for as well as the computers themselves become more and more sophisticated. Of course, not everyone has the need or even the desire for the most state of the art computer system. However, in order to appeal to average computer consumers, computers are being designed to incorporate more features but at constantly diminishing prices. Today, computer systems with multimedia capabilities are more the norm than the exception. These multimedia capabilities include connections for sound and video inputs and outputs. Often times, these computer systems will include modems that feature speaker phone and answering machine capabilities.

At first, it may seem that the computer industry is in a no win situation of being required to offer more features at lower prices. But continuing technological advancements in the design and manufacture of electronic components have propelled the computer industry into a realm of sustained growth. Furthermore, new manufacturing practices and circuit designs are constantly being developed that rival existing practices and circuits.

One area of development is the manipulation and control of different forms of audio data by a computer system with sound capabilities. The sound output may be produced from the computer's own internal speaker or a more elaborate external multi channel speaker system connected to the computer's audio outputs. Regardless of which speaker system is implemented, users of the computer system expect a linear relationship between movement of a volume control slide bar on the computer display and the perceived volume of the sound output. However, since the human hearing apparatus has an inherently logarithmic response, the digital audio signal must be scaled in a logarithmic manner so as to provide the human ear with a linear sensation of volume variations similar to that experienced from turning a volume knob on a radio or stereo receiver.

Currently, boosting and attenuation of digital audio signals are accomplished by linear multiplier blocks. Given that almost all digital audio signals are encoded in 2's complement pulse code modulation (PCM) form, high precision multipliers and large lookup tables must be used to manipulate the PCM data in the required logarithmic fashion without losing resolution at the lower end of the scale. The large lookup tables provide entries for the numerous multiplicands that are used to multiply the PCM data. Because the PCM data is scaled in a logarithmic manner, very high precision coefficients are required in order to manipulate the PCM data so that the multimedia enabled computer user's experience is consistent with that which is already in existence in the world of consumer audio, namely the inear sensation of volume variations.

Therefore, it is desirable to provide an apparatus and methods of operating the same which can reduce the complexity and inefficiency associated with manipulating digital audio signal levels.

SUMMARY OF THE INVENTION

The present invention provides an apparatus for controlling audio signals having pulse code modulation (PCM) data and methods of operating the same resulting in an efficient means of amplitude modulation of audio signals. The novel apparatus for controlling audio signals is based on exploiting an inherent logarithmic nature of the PCM encoded data. Thus, according to one aspect of the invention, the apparatus for controlling audio signals comprises a PCM data input register configured to store the PCM data. A shift register is coupled to the PCM data input register configured to serially shift the PCM data. A PCM data output register is coupled to the shift register configured to store modified PCM data. An audio magnitude controller is coupled to the shift register configured to control serial shifting of the shift register to provide the modified PCM data.

According to one aspect of the invention, the shift register bidirectionally shifts the PCM data in response to the audio magnitude controller. The reason for this bidirectional shifting is twofold: 1) most PCM data streams are received in an "MSB-first" (most significant bit first) manner, but in order to utilize an efficient hardware implementation, the present invention chooses to use bit-serial arithmetic which operates in an "LSB-first" (least significant bit first) manner; 2) PCM audio signal encoding process itself maps different amplitude values to different positions within the serial bitstream. By shifting the entire audio "word" in one direction or the other, the present invention effects an amplitude change without modifying the actual PCM-encoded data word itself. Depending on which direction the PCM data is shifted, the audio signal is boosted or attenuated. The shift register shifts the PCM data a single bit left to provide an audio signal boost. The shift register shifts the PCM data a single bit right to provide an audio signal attenuation.

According to another aspect of the invention, a PCM data adder is coupled between the PCM data input register and the shift register and to the audio magnitude controller configured to add the least significant bits (LSB's) of the PCM data to provide the modified PCM data in a bit-serial fashion. The PCM data adder includes logic configured to selectively sum different bit positions of the PCM data in response to the audio magnitude controller. The PCM data adder includes a plurality of serial adders to sum the LSB's of the PCM data. Adding different combinations of various bit shifted versions of the same PCM input data generates different logarithmic weightings for the PCM data to afford additional translation flexibility.

Thus, an apparatus and method for controlling audio signals are provided whereby bit shifting PCM data provides logarithmic modulation of the audio signals for scaling the logarithmic modulation value to a linear amplitude control value.

Other aspects and advantages of the present invention can be seen upon review of the figures, the detailed description, and the claims which follow.

DETAILED DESCRIPTION OF THE INVENTION

Figure 1:
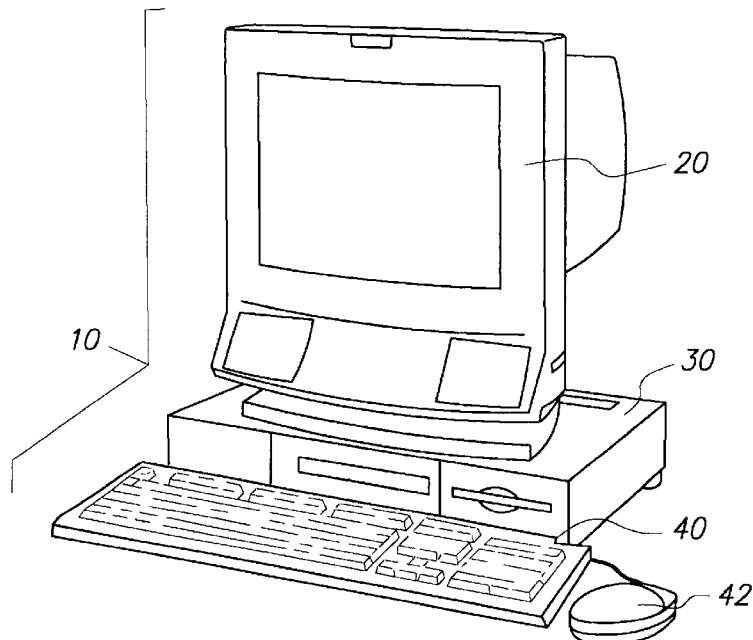
FIGS. 1 illustrates a computer system incorporating an apparatus for controlling audio signals in accordance to the present invention.

The invention will be described with respect to the Figures in which FIG. 1 generally shows a computer system 10. The computer system 10 includes a display 20, an enclosure 30, a keyboard 40, and a mouse 42. The display 20 is coupled to the enclosure 30 and provides an output in response to signals generated by circuits within the enclosure 30. The enclosure 30 contains the "brains" and processing for the computer system 10. The enclosure 30 may include a central processing unit (CPU), connections for audio input and output, video input and output, memory, data storage device, and an audio output device such as a speaker. The keyboard 40 and the mouse 42 are coupled to the enclosure and provide inputs to the various circuit components within the enclosure 30.

For example, during operation of the computer system 10, an operating system is loaded to the memory and the CPU executes program applications and commands in response to data stored on the data storage device and/or commands from the keyboard or mouse. The results of the program applications and commands are shown on the display 20 or presented as an audio output signal, either to a device attached to or within the enclosure 30. Thus, the computer system 10 operates like a generic computer which is well known in the art.

Figure 2:
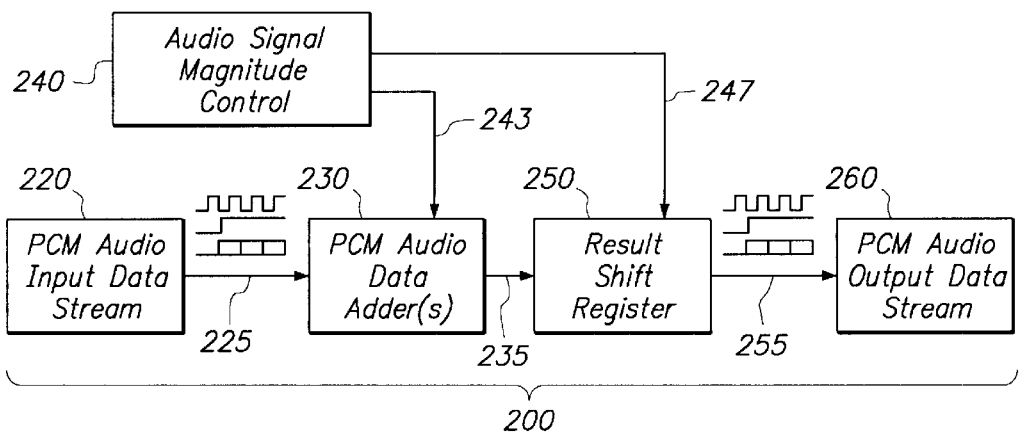
FIG. 2 illustrates a simplified block diagram of a digital audio signal modulator in accordance to the present invention.

FIG. 2 illustrates a simplified block diagram of a digital audio signal modulator 200 according to the present invention. The digital audio signal modulator 200 is housed within the enclosure 30 and provides boosting and attenuation of digital audio signals. The digital audio signal modulator 200 includes a pulse code modulation (PCM) data input stream source 220, a serial PCM data adder 230, an audio magnitude controller 240, a result shift register 250, and a PCM data output stream 260. The PCM data input stream 220 comprises an audio signal which is encoded in 2's complement linear PCM format and provides PCM input data to the serial PCM data adder 230 on line 225. Those skilled in the art will realize that this PCM data input stream 220 may be generated externally to the digital audio signal modulator 200 by some independent source. The audio magnitude controller 240 provides adder control signals (243) to control operations of the PCM data adder 230. Depending on the adder control signals (243), the serial PCM data adder 230 sums various combinations of the PCM input data to achieve a result consisting of different logarithmic weightings. Finally, the resultant data generated by the serial PCM data adder 230 may be scaled further by the shift register 250 in order to produce the desired manipulation of the PCM data.

Thus, as the serial PCM data adder 230 provides weighted PCM data on line 235 to the shift register 250, the audio magnitude controller 240 provides a shift register control signal on line 247 to control arithmetic shifting of the weighted PCM data in the shift register 250. The shift register 250 modulates the weighted PCM data by approximately 6 dB with each bit shift of the PCM data. For example, an arithmetic shift of a single bit left of the weighted PCM data boosts the amplitude of the PCM data by 6 dB. Conversely, an arithmetic shift of a single bit right of the weighted PCM data attenuates the amplitude of the PCM data by 6 dB. The shift register 250 provides modulated PCM data to the PCM data output stream 260 on line 255 in the same format as the input data stream 220.

Figure 3:
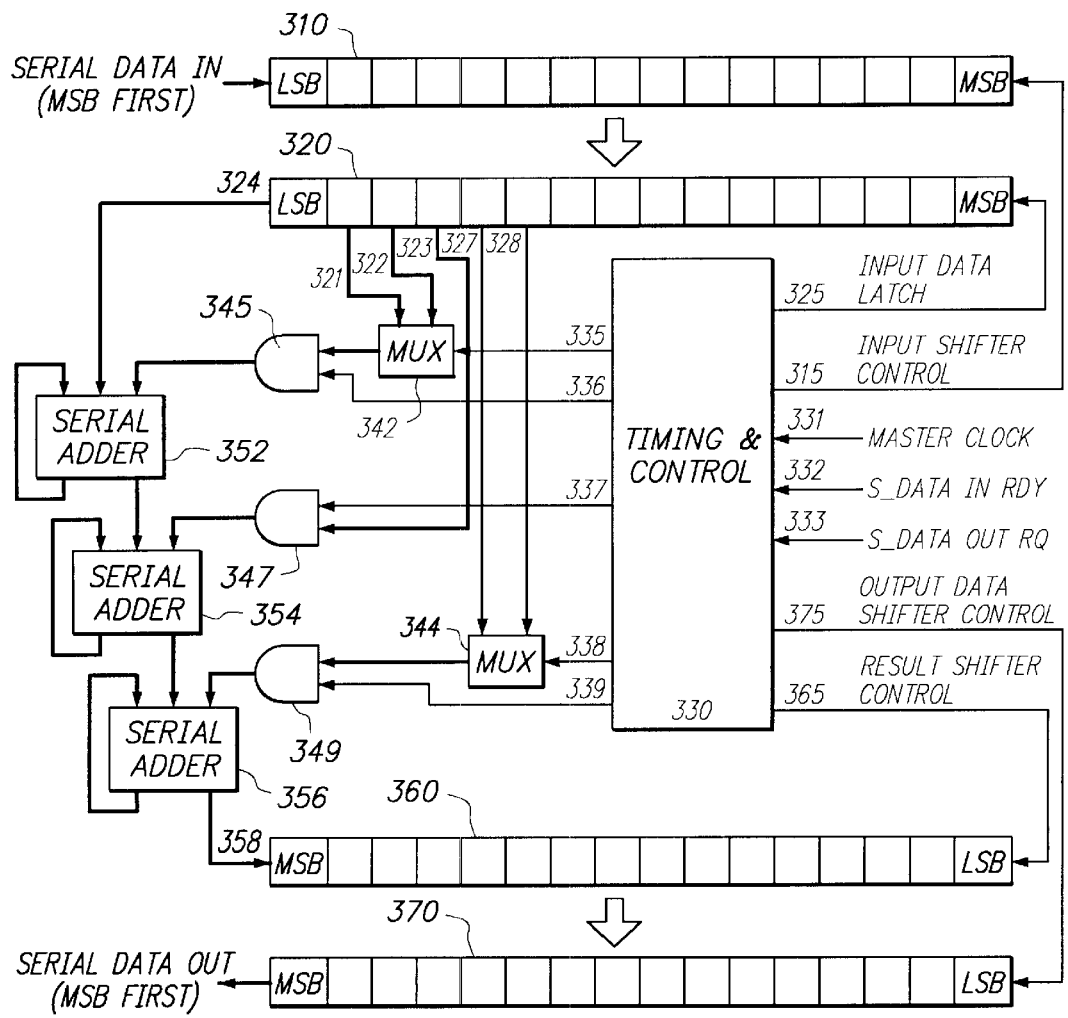
FIG. 3 illustrates a block diagram of an implementation of the digital audio signal modulator in accordance to the present invention.

FIG. 3 illustrates a block diagram of an implementation of the digital audio signal modulator 200 according to the present invention. Input shift register 310 receives serial PCM data in most significant bit (MSB) first format. Timing and control block 330 provides a input shift signal on line 315 which controls shifting of the PCM data into the input shift register 310 and a further data latch signal 325, which loads the PCM data to the shift register 320. One state of this data latch signal 325 effects a parallel loading function of the audio data from the input shift register 310 to shift register 320. The other state of the data latch signal 325 initiates a serial shifting of the PCM data in least significant bit (LSB) first format to serial adder 352 on line 324.

The timing and control block 330 includes input control signals master clock on line 331, serial data in ready (S_DATA IN RDY) on line 332, and serial data out request (S_DATA OUT RQ) on line 333. The input control signals serial data in ready (S_DATA IN RDY) on line 332, and serial data out request (S_DATA OUT RQ) on line 333 afford asynchronous operation of the digital audio signal modulator 200 with respect to the input and output PCM data streams.

Referring again to FIG. 3, as the serial adder 352 receives the bit shifted PCM data, inputs to mux 342 on lines 321 and 322, gate 347 on line 323, and mux 344 on lines 327 and 328 also receives the PCM data from the original PCM data word, but from different bit positions in the PCM data word.

The timing and control block 330 further provides control signals to effect different weighting of the incoming PCM data. The PCM data responsive to the control signals on lines 335, 336, 337, 338, and 339 and the combination logic of mux 342 with gate 345, gate 347, and mux 344 with gate 349 provides inputs to serial adder 352, serial adder 354, and serial adder 356. The chain of serial adders are controlled by the signals on lines 335, 336, 337, 338, and 339, resulting in a selective summation of combinations of various bit shifted versions of the PCM data that result in different logarithmic weightings other than +/−6 dB. For example, a sum of two terms, one at 6 dB (one bit shift) and another at 12 dB (shifted by two bit positions) will produce a weighted logarithmic gain with a range of 16 dB in variations of 6 dB steps. The final serial adder 356 provides weighted PCM data on line 358 to a scaling register 360.

In this manner, the output of serial adder 356 on line 358 comprises a selective summation of the six least significant bits of shift register 320. As the data is shifted in LSB first format through shift register 320 and the chain of serial adders 352, 354 and 356, the output of serial adder 356 is shifted into scaling register 360 in response to shifter control on line 365 from the timing and control block 330. With one state of shifter control signal on line 365, the data on line 358 is shifted into scaling register 360. With the other state of shifter control, the data contained in scaling register 360 is "frozen". Once the desired result is correctly positioned within the scaling register 360, the data is then transferred to data output register 370 by a parallel loading of the data from register 360. This transfer is controlled by the state of the output shifter control signal on line 375. In one state, the audio word of data output register 370 is loaded directly from scaling register 360. In the other state, the audio word in data output register 370 is shifted out in an MSB-first format.

data. By choosing appropriate weightings, the gain transfer function can be made to remain monotonic, which is very desirable for maintaining low distortion in audio signals. In the implementation of the digital audio signal modulator 200 of FIG. 3, the average logarithmic step size of 1.5 dB increments is achieved using three additions of four components to the serial adders. The maximum difference between any of the step sizes is less than 0.05 dB. A 0.05 dB increment produces such linear variations that the differences in the various step sizes are inaudible to the human ear. Table I illustrates the logarithmic step sizes and the absolute linearity errors in the step function for the selected weight function having four components as described in FIG. 3.

TABLE I

6dB span: 4 steps  average step error: 0.03 dB
target step size: -1.51 dB  maximum step error: -0.05 dB

| 1 + 256 | 1 + 128 | 1 + 64 | 1 + 32 | 1 + 16 | 1 + 8 | 1 + 4 | 1 + 2 | | |
|---|---|---|---|---|---|---|---|---|---|
| -48.16 dB | -42.14 dB | -36.12 dB | -30.10 dB | -24.08 dB | -18.06 dB | -12.04 dB | -6.02 dB | result | delta step |
| | | | | | | | | 0 | |
| | | | | | | | 1 | -1.48 dB | -1.48 dB |
| | | | | | | 1 | 1 | -3.06 dB | -1.58 dB |
| | | | | | 1 | 1 | 1 | -4.53 dB | -1.47 dB |
| | | | | 1 | 1 | 1 | 1 | -6.02 dB | -1.49 dB |
| | | | | | | | | -7.50 dB | -1.48 dB |
| | | | 1 | 1 | 1 | 1 | | -9.08 dB | -1.58 dB |
| | | 1 | 1 | 1 | 1 | | | -10.55 dB | -1.47 dB |
| | 1 | 1 | 1 | 1 | | | | -12.04 dB | -1.49 dB |
| | | | | | | | | -13.52 dB | -1.48 dB |
| | 1 | | 1 | 1 | | | | -15.10 dB | -1.58 dB |
| 1 | | 1 | 1 | | | | | -16.57 dB | -1.47 dB |
| 1 | 1 | 1 | | | | | | -18.06 dB | -1.49 dB |

Signal Line 321  ...Line 322  ...Line 323  ...Line 324  ...Line 325  ...Line 326
data  data  data  data  data  data As stated earlier, PCM-encoded audio data is scaled to the desired range in approximately 6 dB increments by arithmetic shifting. This arithmetic shifting of the data in scaling register 360 is accomplished by adjusting the timing of the signal on lines 365 and 375 from the timing and control block 330. If the shifter control signal on line 365 is set to allow the data in scaling register 360 to shift, then the consequence is that the data is arithmetically shifted by one bit position to the right, which corresponds to a reduction in gain of the audio data stored in the scaling register 360 by approximately 6 dB. In this manner, the output on line 358 of the serial adder chain is scaled up or down in amplitude of approximately 6 dB increments.

Thus, unlike the traditional approach of using a high precision multiplier in combination with a large lookup table for the multiplicands, the logarithmically spaced steps produced from summing various bit shifted PCM data do not require maintenance of a lookup table beyond the 0 dB (unity gain) to +/-6 dB range.

The minimum step size can be varied depending on the number of terms which are summed for the weighted PCM The table I entries correspond to inputs to the serial adders in FIG. 3 to achieve a 6 dB span in 4 steps with a target step size of -1.51 dB. The control signals of the timing and control block 330 controls the combinational logic to provide the entries to the serial adders in FIG. 3. The different columns represent different bit positions within the shift register 320. More specifically, if there is a value of "1" in the column, then the data from that bit position is to be summed into the final result. If there is not an entry in that column, then the data is not to be summed into the final result.

Table II illustrates a variation of logarithmic step sizes and the absolute linearity errors in the step function for another selected weight function having four components as illustrated in FIG. 3. The table II entries correspond to inputs to the serial adders in FIG. 3 to achieve a 6 dB span in 7 steps with a target step size of -0.86 dB. Those skilled in the art will note that in this case, the serial adders 352, 354 and 356 would remain the same, but both the combinatorial logic blocks 342, 344, 345, 347 and 349 as well as the control signals on lines 335, 336, 337 and 338 would be implemented differently than in the previous embodiment. However, the basic configuration of the series of serial adders, combinational logic and the control block remains effectively similar to that shown in FIG. 3.

TABLE II

6dB span: 7 steps  
target step size: -0.86 dB  
average step error: 0.02 dB  
maximum step error: -0.08 dB

| | 1 + 512 | 1 + 256 | 1 + 128 | 1 + 64 | 1 + 32 | 1 + 16 | 1 + 8 | 1 + 4 | 1 + 2 | | |
|---|---|---|---|---|---|---|---|---|---|---|---|
| | -54.19 dB | -48.16 dB | -42.14 dB | -36.12 dB | -30.10 dB | -24.08 dB | -18.06 dB | -12.04 dB | -6.02 dB | result | delta step |
| | | | | | | | | | | 0 | |
| 0 dB to -6 dB range | | | | | 1 | | 1 | 1 | 1 | -0.86 dB | -0.86 dB |
| | | | 1 | | | | 1 | | 1 | -1.72 dB | -0.87 dB |
| | | | | | | | | | 1 | -2.50 dB | -0.78 dB |
| | | | | 1 | | 1 | | 1 | 1 | -3.45 dB | -0.96 dB |
| | | | | | | | 1 | | 1 | -4.30 dB | -0.85 dB |
| | | 1 | | | 1 | | 1 | | 1 | -5.18 dB | -0.88 dB |
| | | | | | | | | | 1 | -6.02 dB | -0.84 dB |
| -6 dB to -12 dB range | 1 | | | 1 | | 1 | | 1 | | -6.88 dB | -0.86 dB |
| | 1 | | 1 | | | | 1 | | | -7.74 dB | -0.87 dB |
| | 1 | | | | | | | | | -8.52 dB | -0.78 dB |
| | 1 | | | 1 | | 1 | | 1 | | -9.47 dB | -0.96 dB |
| | 1 | | | | | | 1 | | | -10.32 dB | -0.85 dB |
| | 1 | 1 | | | 1 | | 1 | | | -11.20 dB | -0.88 dB |
| | 1 | | | | | | | | | -12.04 dB | -0.84 dB |

Table III illustrates a variation of logarithmic step sizes and the absolute linearity errors in the step function for another selected weight function having, three components. The table III entries correspond to inputs to serial adders to achieve a 6 dB span in 5 steps with a target step size of −1.20 dB.

Table IV illustrates yet another variation of logarithmic step sizes and the absolute linearity errors in the step function for another selected weight function having three components. The table IV entries correspond to inputs to serial adders to achieve a 6 dB span in 3 steps with a target step size of −2.01 dB.

TABLE III

6dB span: 5 steps  
target step size: -1.20 dB  
average step error: 0.05 dB  
maximum step error: 0.09 dB

| | 1 + 256 | 1 + 128 | 1 + 64 | 1 + 32 | 1 + 16 | 1 + 8 | 1 + 4 | 1 + 2 | | |
|---|---|---|---|---|---|---|---|---|---|---|
| | -48.16 dB | -42.14 dB | -36.12 dB | -30.10 dB | -24.08 dB | -18.06 dB | -12.04 dB | -6.02 dB | result | delta step |
| | | | | | | | | | 0 | |
| 0 dB to -6 dB range | | | | | | 1 | 1 | 1 | -1.16 dB | -1.16 dB |
| | | | 1 | | | | 1 | 1 | -2.32 dB | -1.16 dB |
| | | | | | | 1 | 1 | 1 | -3.66 dB | -1.34 dB |
| | | 1 | | | 1 | | | 1 | -4.88 dB | -1.22 dB |
| | | | | | | | | 1 | -6.02 dB | -1.14 dB |
| -6 dB to -12 dB range | | | | | 1 | 1 | 1 | | -7.18 dB | -1.16 dB |
| | | 1 | | | | | 1 | | -8.34 dB | -1.16 dB |
| | | | 1 | | | 1 | 1 | | -9.68 dB | -1.34 dB |
| | 1 | | | 1 | | | | | -10.90 dB | -1.22 dB |
| | 1 | | 1 | | | | | | -12.04 dB | -1.14 dB |

TABLE IV

6dB span: 3 steps  average step error: 0.18 dB
target step size: -2.01 dB  maximum step error: -0.50 dB

| range | 1÷32 | 1÷16 | 1÷8 | 1÷4 | 1÷2 | result | delta step |
|---|---|---|---|---|---|---|---|
| | -30.10 dB | -24.08 dB | -18.06 dB | -12.04 dB | -6.02 dB | | |
| | | | | | | 0.00 | |
| 0 dB to -6 dB | | | ▓ | ▓ | ▓ | -2.50 dB | -2.50 dB |
| | | | 1 | | ▓ | -4.08 dB | -1.58 |
| | | | ▓ | ▓ | ▓ | -6.02 dB | -1.94 |
| -6 dB to -12 dB | | | ▓ | ▓ | | -8.52 dB | -2.50 |
| | | 1 | ▓ | | | -10.10 dB | -1.58 |
| | | ▓ | ▓ | | | -12.04 dB | -1.94 |
| -12 dB to -18 dB | ▓ | ▓ | | | | -14.54 dB | -2.50 |
| | 1 | ▓ | | | | -16.12 dB | -1.58 |
| | ▓ | | 1 | | | -18.06 dB | -1.94 |

Thus, it is illustrated that the choice of different weighting functions may produce different results and that the implementation complexity may be traded off with the range and accuracy of the result.

While the foregoing detailed description has described several embodiments of the apparatus and methods for amplifying and attenuating digital audio in accordance with this invention, it is to be understood that the above description is, illustrative only and not limiting of the disclosed invention. Obviously, many modifications and variations will be apparent to the practitioners skilled in the this art. Accordingly, the apparatus and methods for amplifying and attenuating digital audio has been provided. The apparatus for amplifying and attenuating digital audio takes advantage of the inherently logarithmic nature of the PCM-encoded digital audio signal to efficiently scale the digital audio signal in a logarithmic manner, which produces a natural linear sensation of volume variations to the human ear.

What is claimed is:

1. An apparatus for controlling audio signals having pulse code modulation (PCM) data, comprising:
   a PCM data input register configured to store the PCM data;
   a shift register coupled to the PCM data input register configured to serially shift the PCM data;
   a PCM data output register coupled to the shift register configured to store modified PCM data; and
   an audio magnitude controller coupled to the shift register configured to control serial shifting of the shift register to provide the modified PCM data;
   wherein the shift register bidirectionally shifts the PCM data in response to the audio magnitude controller, and the shift register shifts the PCM data one of a single bit left and a single bit right in order to provide one of an audio signal boost and an audio signal attenuation.

2. The apparatus of claim 1 further comprising a PCM data adder coupled between the PCM data input register and the shift register and to the audio magnitude controller configured to add least significant bits (LSB's) of the PCM data to provide the modified PCM data.

3. The apparatus of claim 2, wherein the PCM data adder includes adder logic configured to selectively sum LSB's of the PCM data in response to the audio magnitude controller.

4. The apparatus of claim 3, wherein the PCM data adder includes a plurality of serial adders to add the LSB's of the PCM data.

5. A computer system having an audio output for PCM data, comprising:
   a display configured to provide video data;
   an input device configured to provide commands to the computer system; and
   a processor enclosure configured to process the commands for the computer system wherein the processor enclosure includes:
   a PCM data input register configured to store the PCM data;
   a shift register coupled to the PCM data input register configured to serially shift the PCM data;
   a PCM data output register coupled to the shift register configured to store modified PCM data;
   an audio magnitude controller coupled to the shift register configured to control serial shifting of the shift register to provide the modified PCM data, wherein the shift register bidirectionally shifts the PCM data in response to the audio magnitude controller; and
   a PCM data adder coupled between the PCM data input register and the shift register and to the audio magnitude controller configured to add least significant bits (LSB's) of the PCM data to provide modified PCM data.

6. The apparatus of claim 5, wherein the PCM data adder includes:
   a plurality of serial adders to add the LSB's of the PCM data; and
   adder logic configured to selectively sum LSB's of the PCM data in response to the audio magnitude controller.

7. A method of controlling audio signals having pulse code modulation (PCM) data comprising the steps:
   storing the PCM data in a PCM data shift register;
   shifting the PCM data in the PCM data shift register; and
   controlling the shift register to control bidirectional shifting of the PCM data to provide modified PCM data by performing one of shifting the PCM data a single bit left and shifting the PCM data a single bit right to provide one of an audio signal boost and an audio signal attenuation.

8. The method of controlling audio signals of claim 7 further comprising the step adding least significant bits (LSB's) of the PCM data to provide modified PCM data.

* * * * *